United States Patent
Buschmann et al.

(10) Patent No.: US 10,164,630 B2
(45) Date of Patent: Dec. 25, 2018

(54) ACTIVATION DEVICE FOR A MOTOR VEHICLE

(71) Applicant: HUF HÜLSBECK & FÜRST GMBH & CO. KG, Velbert (DE)

(72) Inventors: Gerd Buschmann, Velbert (DE); Peter Van Gastel, Solingen (DE); Markus Klameth, Altdorf (DE); Thomas Metzner, Holzgerlingen (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 3 days.

(21) Appl. No.: 15/112,139

(22) PCT Filed: Dec. 19, 2014

(86) PCT No.: PCT/EP2014/078667
§ 371 (c)(1),
(2) Date: Jul. 15, 2016

(87) PCT Pub. No.: WO2015/110239
PCT Pub. Date: Jul. 30, 2015

(65) Prior Publication Data
US 2016/0329894 A1    Nov. 10, 2016

(30) Foreign Application Priority Data
Jan. 22, 2014   (DE) .......................... 10 2014 100 698

(51) Int. Cl.
*H03K 17/955*  (2006.01)
*H03K 17/945*  (2006.01)

(52) U.S. Cl.
CPC ... *H03K 17/955* (2013.01); *H03K 2017/9455* (2013.01); *H03K 2217/96042* (2013.01);
(Continued)

(58) Field of Classification Search
CPC ....... H03K 17/955; H03K 2217/96042; H03K 2217/96079; H03K 2217/96054; H03K 2217/69077; H03K 2217/9455
See application file for complete search history.

(56) References Cited

U.S. PATENT DOCUMENTS 6,774,505 B1    8/2004  Wnuk
7,232,973 B2 *  6/2007  Kaps ................... H03K 17/962
                                                    200/600
(Continued)

FOREIGN PATENT DOCUMENTS

DE    10 2004 024 263 A1    3/2005
DE    20 2005 013 420 U1    11/2005
(Continued)

OTHER PUBLICATIONS

International Preliminary Report on Patentability of International Applicatno No. PCT/EP2014/078667 dated Jul. 26, 2016 and English Translation, 15 pages.
(Continued)

Primary Examiner — Thomas J. Hiltunen
(74) Attorney, Agent, or Firm — Fay Sharpe LLP

(57) ABSTRACT

An activation device for actuation of a vehicle function includes a cover element, a light distribution device arranged under the cover element, and a light source arranged under or in the light distribution device. The light source and the light distribution device are arranged for backlighting the cover element. The cover element includes an outward directed operation area at least partially formed of an electrically-conductive metallic material with the operation area being galvanically decoupled from the remaining components. A circuit board is arranged under the light distribution device with a capacitive sensor such that the capacitive sensor is coupled to the operation area. The
(Continued)

control and evaluation circuit is coupled to the light source and the proximity sensor to control the light source depending on an approach.

14 Claims, 2 Drawing Sheets

(52) U.S. Cl.
  CPC .............. *H03K 2217/96054* (2013.01); *H03K 2217/96077* (2013.01); *H03K 2217/96079* (2013.01)

(56) References Cited

U.S. PATENT DOCUMENTS

| | | | | |
|---|---|---|---|---|
| 7,370,983 | B2 * | 5/2008 | DeWind | B60K 35/00 359/844 |
| 7,576,631 | B1 * | 8/2009 | Bingle | E05B 81/76 340/5.54 |
| 8,154,418 | B2 * | 4/2012 | Peterson | B60R 1/12 340/425.5 |
| 8,168,908 | B2 * | 5/2012 | Heimann | H03K 17/962 200/600 |
| 8,326,501 | B2 * | 12/2012 | Hustyi | F16H 59/02 701/36 |
| 8,552,746 | B2 * | 10/2013 | Pfau | H03K 17/962 324/658 |
| 8,866,750 | B2 * | 10/2014 | Bentsen | G06F 3/03547 345/173 |
| 9,346,403 | B2 * | 5/2016 | Uken | B60R 1/12 |
| 9,530,586 | B2 * | 12/2016 | Hanada | H01H 9/161 |
| 9,539,939 | B2 * | 1/2017 | Salter | B60Q 3/0223 |
| 9,559,688 | B2 * | 1/2017 | Salter | H03K 17/955 |
| 2011/0043227 | A1 | 2/2011 | Pance et al. | |
| 2011/0298699 | A1 | 12/2011 | Goto et al. | |
| 2012/0075486 | A1 * | 3/2012 | Lee | G06F 3/023 348/207.99 |
| 2013/0062182 | A1 | 3/2013 | Tokura et al. | |
| 2014/0268628 | A1 * | 9/2014 | Mann | G08C 17/00 362/23.1 |
| 2014/0368029 | A1 * | 12/2014 | Park | H03K 17/945 307/9.1 |
| 2015/0177298 | A1 * | 6/2015 | Sugiura | G06F 3/044 324/658 |
| 2015/0277620 | A1 * | 10/2015 | Bulea | G06F 3/0202 345/168 |
| 2016/0214525 | A1 * | 7/2016 | Sheehan | B60Q 1/0023 |
| 2016/0221497 | A1 * | 8/2016 | Schindler | B60Q 1/2669 |
| 2017/0040306 | A1 * | 2/2017 | Kim | H01L 25/167 |
| 2017/0201254 | A1 * | 7/2017 | Hanssen | H03K 17/962 |

FOREIGN PATENT DOCUMENTS

| | | |
|---|---|---|
| DE | 10 2006 003 174 A1 | 7/2007 |
| DE | 10 2009 007 707 A1 | 8/2010 |
| DE | 10 2009 001 412 A1 | 9/2010 |
| DE | 10 2010 010 574 A1 | 9/2011 |
| EP | 2 067 665 A1 | 6/2009 |
| WO | WO 2009/153161 A1 | 12/2009 |

OTHER PUBLICATIONS

International Search Report of International Application No. PCT/EP2014/078667 dated Apr. 7, 2015, 6 pages.

\* cited by examiner

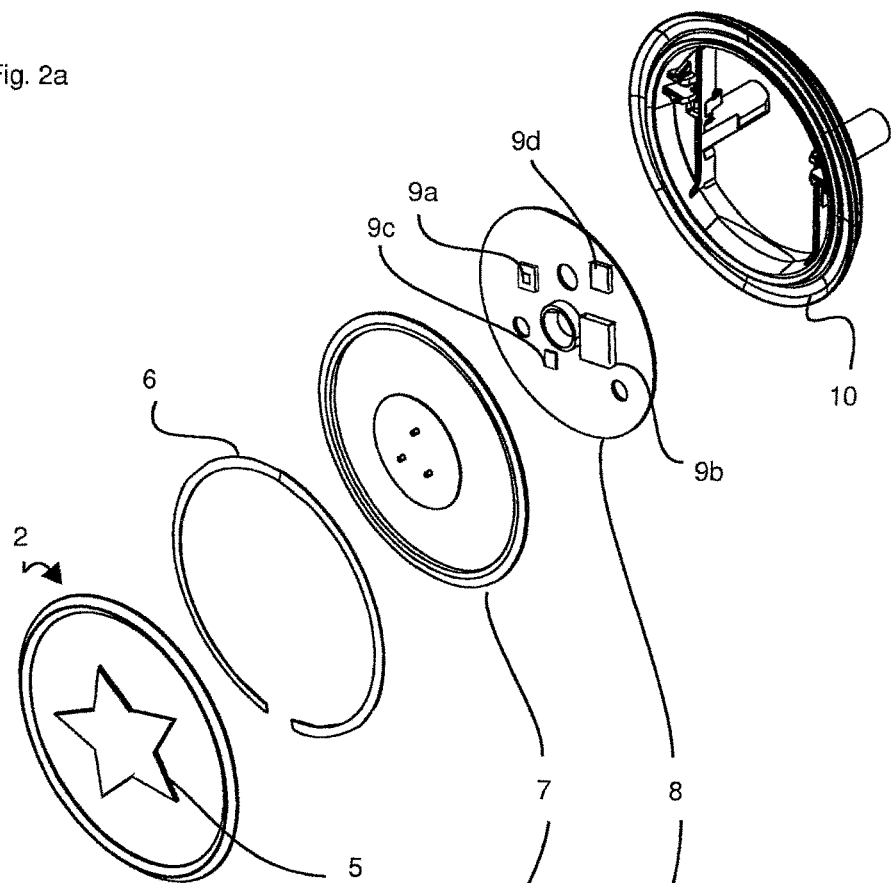
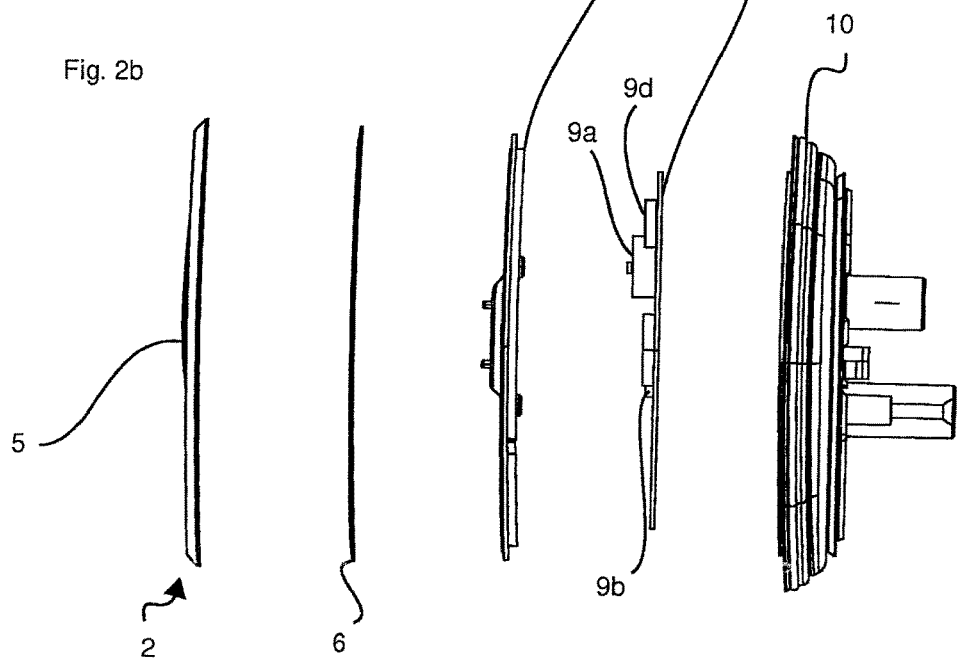

ACTIVATION DEVICE FOR A MOTOR VEHICLE

BACKGROUND

The invention relates to an activation device for use on a motor vehicle. In particular, the invention relates to an assembly, which is arranged on the motor vehicle to enable an actuation of a vehicle function.

In the prior art are known numerous assemblies for vehicles that serve different functions.

An assembly is known for example from EP 2 067 665 A1. There, a manufacturer's emblem or manufacturer's logo is attached to a vehicle and backlit by a light source and a light-conducting device.

Another backlit vehicle logo is known from DE 10 2004 024 263 A1. Therein the said illuminated vehicle emblems serve exclusively for the improvement of the design and improved perceived value of a vehicle. However, they do not bring any further functional benefit.

The invention has for its object to provide an integrated multifunctional assembly for vehicles.

BRIEF SUMMARY

This object is achieved by an activation device having the features of claim 1.

According to the invention, a shaped decorative element, in particular a vehicle emblem (or manufacturer emblem) is combined with a proximity sensor technology to provide an assembly for operating a vehicle function.

For this purpose, the assembly according to the invention has an upper cover element facing the user which is partially designed as vehicle emblem. When this vehicle emblem is mentioned, any ornamental or brand element is meant whose function is to make a visual enhancement or marking of the vehicle. The cover element is at least partially formed of a metallic material or provided with a metallic coating.

According to the invention, a light-distribution device is arranged under this cover element. Under the light-distribution device or therein a light source is arranged so that by the combined effect of the light source and the light-distribution device a backlighting of the cover element arranged thereon is achieved.

Schematically, up to this point the structure is similar to the above-mentioned prior art, in particular EP 2 067 665 A1. There, a light-conducting device with light-conducting surfaces or light deflection surfaces is used as the inventive light-distribution device. However, a different type of the light-distribution device, for example a multi-core optical fiber device or a diffuser can be used as well.

According to the invention, the function of the assembly, however, is not exhausted in the backlighting of a decorative element, but serves the sensing of function operations.

For this purpose, the cover element is electrically isolated from the other conductive elements around the operating device. In particular, a galvanic decoupling of the cover element from the vehicle mass is provided. This decoupling can be accomplished by insulating elements between the cover element and other components; however, the insulation can in particular be also realized by the light-conducting device or light-distribution device arranged under the cover element. For this purpose, the light-conducting device or light-distribution device is made of an electrically insulating material, for example, a transparent plastic or glass.

Under the light-distribution device a circuit board with a capacitive coupling element is arranged, for example, a capacitive sensor. The capacitive sensor is spaced from the metal cover element at least by the light-conducting device or light-distribution device, i.e. galvanically decoupled from the metal cover element but capacitively coupled therewith. Changes in the capacitance of the cover element act accordingly directly on the capacitive sensor element. The actual sensor is, however, protected and mounted largely shielded against environmental influences, only the cover element is exposed and can be affected in its capacity by an operator by the approach of a body part or by touching.

The proximity sensor senses by the light-distribution device a capacitance change caused by the approach of a user to the cover element. Since the sensor is located on the side of the cover element facing away from the user, the user sees the illuminated cover element without the disturbing sensor elements and can easily locate the sensed surface.

The manufacturer emblems or vehicle emblems are placed in prominent places on the vehicle so that locating these emblems poses no problem. This is an advantage of the invention, because the actuator simultaneously acts as a design element and is to be placed in prominent, easily accessible places on the vehicle. In contrast, in the prior art, control elements are often placed discreetly but at places with problematic access, because they can detract from the appearance of a vehicle. Furthermore, in the invention the cover element with the light-distribution device protects the actual capacitive sensor from environmental influences.

With both the light source and the capacitive sensor, but not with the cover element, a control and evaluation circuit is coupled, which can be arranged directly on the circuit board, but can be placed also at another position of the assembly. This control and evaluation circuit controls the capacitive sensor in the technically intended manner. Capacitive proximity sensors are suitable as sensors. They are available in the market and provided with appropriate switching rules. Capacitive sensors can be formed by metal surfaces, which are coupled with a suitable charging electronics. The detection range of the sensor extends through the components arranged in front of it facing the user and the sensor senses, without contact, the approach of a user. In the inventive device, the cover element acts as an additional coupling electrode of the capacitive sensor. This requires no galvanic coupling, the spaced-apart, fixed arrangement of the cover element and the underlying sensor allow the coupling of a static basic capacity of the cover element to the sensor. When an operator approaches the cover element, this basic capacity is changed and the sensor detects this change in capacitance.

Depending on the sensing of the approach and the control signals of the vehicle, the control and evaluation device is able to activate the light source in the operating device. This activation can be done in many ways. For example, the light can be used to guide the user in the use. The color of the light source can also be modified to indicate an operating state of the device. For example, the vehicle emblem can be backlit in a first color when the vehicle or a flap which can be opened by means of the operating device, is in the locked state. The color can be changed in dependence on the locking state. In addition, the lighting device can be controlled in order to acknowledge the approach of the user or the actuation. Finally, the lighting device can also be used to give the user instructions for correct operation. If for example the user is approaching the operating device or even touches it, this can be considered as a first section of an operating scheme. The control and evaluation device detects this approach and the user's presence in the approximated position. The user can, for example, leave his hand at a distance of a few centimeters distance before the operating device or puts it on the cover element for a few seconds. This is detected by the capacitive sensor due to the capacitive coupling of the cover element.

If the user now wants to access the vehicle function, he will be prompted by a light signal, caused by the control and evaluation device, to again remove the hand within a certain time window or to carry out some other gesture, such as a lift-off and re-laying. If the user follows this requirement, the vehicle function is triggered.

The assembly according to the invention therefore provides a novel combination of visual markers and actuation. The assembly can be used according to aesthetic specifications, but in particular it fulfills the technical purpose in combination with the proximity sensor disposed therein. The proximity sensor coupled with cover element, combined with the light-emitting function, in turn allows a particularly reliable and user-friendly access. Since it is located in an area of the vehicle where a vehicle emblem is regularly positioned for identification, this device should also be advantageously arranged to the vehicle with easy access. The aesthetic effect is thus key or justification of a particularly favorable position on the vehicle and opens up entirely new operating options.

In a preferred embodiment of the invention, the cover element has a partially translucent front side and the light-distribution device is designed for illuminating the translucent sections of the cover element.

Basically, the cover element can be designed completely opaque, i.e. not translucent and, for example, metallized over the entire surface. The light-distribution device then backlights the cover element in such a manner that light emerges along the perimeter of the cover element so that these contour line stands out from the surrounding area. However, the cover element may particularly preferably have translucent sections to allow an even better visual perception of the cover element and the assembly with their actuating function. In this further development of the invention, sections of the cover element are correspondingly metallized, for example, chrome-plated or provided with a metallic coating. The cover element may be formed for example by transparent or opaque plastic bodies, which are partially provided with a chrome plating. The cover element may also be formed in multiple parts. For example, it is possible to provide the cover element with a chrome-plated emblem that is arranged on a transparent or partially transparent support. The cover element is then formed by the combination of the support with the applied emblem.

The light-distribution device can be designed in various ways, for example by a simple plastic disc, into which light from a light source (e.g., LED) is introduced.

The light distribution can also occur in a way that light is conducted to discrete positions for shining through the cover means, for example, by a single fiber or a bundle of optical fibers. In addition, surface light-conducting devices can be designed in the form of diffusers or light-conducting disks with geometric design, in which light exits along lines or surfaces.

BRIEF DESCRIPTION OF THE DRAWINGS

The invention will now be explained in more detail with reference to the accompanying drawings.

FIG. 2a shows a first exploded view of the first embodiment.

FIG. 2b shows a second exploded view of the first embodiment.

DETAILED DESCRIPTION

Figure 1A:
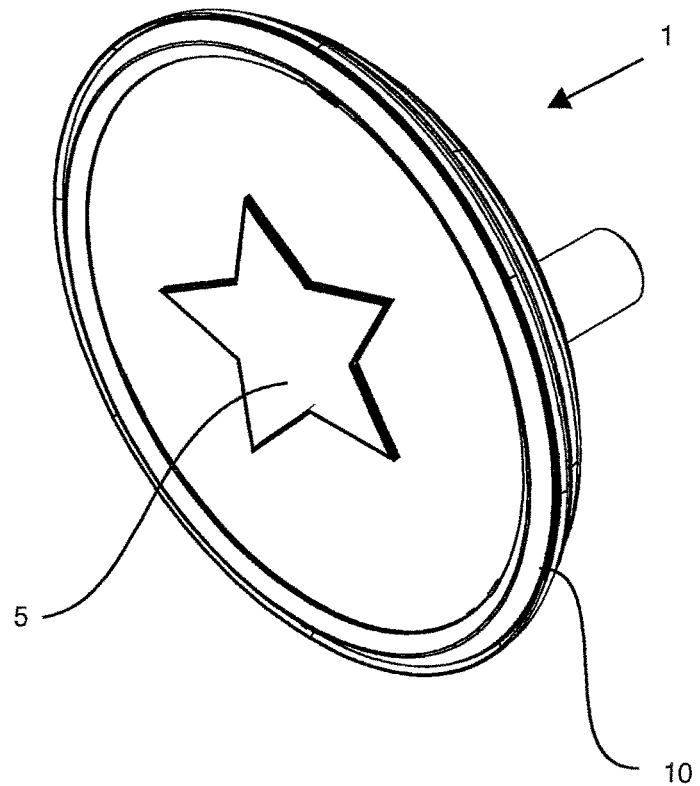
FIG. 1a shows a first embodiment of the invention in a perspective oblique view from the front.
Figure 1B:
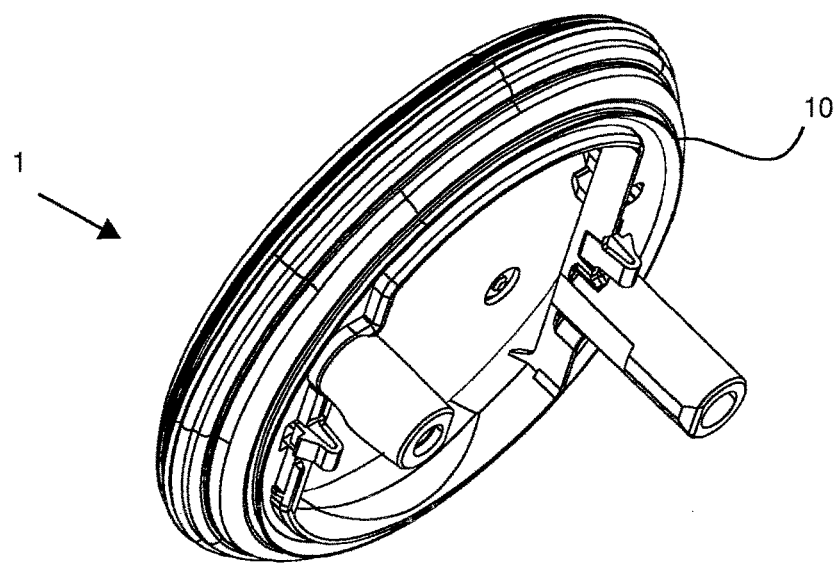
FIG. 1b shows the embodiment of FIG. 1a in a perspective oblique view from behind.

FIGS. 1a and 1b show the inventive operating means 1 in the assembled configuration. The shown assembly may be mounted in a recess on the vehicle panel, e.g. on the tailgate of a vehicle. In this embodiment, the vehicle emblem 5 is shown in a stylized manner.

A plate-shaped housing 10 encloses the various components of the assembly according to the invention, providing mounting possibilities on the back, in particular clips, and apertures for lines, for signal lines and supply lines for the control and evaluation circuit as well as the proximity sensors and the light source.

The inventive assembly shown is compact and includes the functions of the proximity detection, the luminous effect for the vehicle emblem and a push-button switch.

FIGS. 2a and 2b show in respective exploded views the structure of the device according to the invention.

Facing the user, the cover element 2 in this example has a round transparent cover, which has a chrome-plated star emblem 5 in the center. In other embodiments, different, plastically shaped manufacturer emblems can be used; however, a simple element is sufficient to illustrate the invention. The cover element 2 is fixed on the light guide element with a ring-shaped bonding element 6 provided on both sides with an adhesive. The light-conducting element 7 has a similar configuration like the cover element 2 itself, however, is provided with a light-conducting material with corresponding formations in order to ensure a backlighting of the central element 5. For this purpose, the light-conducting element 7 has in the central section a raised light exit surface, which in its contour is located behind the vehicle emblem 5. In this area are also defined light exit points that provide additional background lighting of the chromium element 5.

Behind the light-conducting element 7 a circuit board 8 is arranged. This circuit board is carried by the housing structure 10, as has been shown above with reference to the FIGS. 1a and 1b. The housing 10 is used for fixture to the vehicle and to securely receive the circuit board. In addition, the housing structure is supported on the vehicle and the cover element 2, which is bonded to the light-conducting element 7, can be moved against the housing structure and thus against the circuit board 8 against a spring bias. The spring elements are not shown in this design for reasons of clarity.

On the circuit board 8 both a capacitive sensor 9b is arranged and a surface-mounted LED 9c, which takes over the illumination of the light-conducting element 7. Furthermore, a micro-switch 9a is arranged on the circuit board, which registers a pressure actuation when the components of the cover plate 2 with the light conductor 7 move against the circuit board 8 and trigger the pressure switch 9a in the form of a micro-switch.

The metallized element 5 is visibly galvanically separated from the circuit board by the non-metallized area of the cover element 2, the adhesive layer 6 and the light conductor 7. The emblem 5 is also separated from the vehicle mass. Nevertheless, the metal surface of the emblem 5 is a capacitor area capacitively coupled to the sensor 9b. In this way, the emblem focuses the detection range of the sensor 9b and makes the sensor sensitively respond to approximations to the element 5.

A control and evaluation device 9d is coupled with the components 9a, 9b and 9c.

Thus, the illustrated embodiment provides an operating device which backlights a vehicle emblem or vehicle logo (or manufacturer's logo) and provides the user with a clearly locatable device easy to operate. The user can carry out both a push actuation and an approximation operation registered by the proximity sensor 9b. The control and evaluation device 9a controls the light source 9c depending on the actuations. The light source 9c can thus be controlled in dependence on the mechanical actuator which is sensed by the pressure switch 9a, and also by the approach detection by sensor 9b. In addition, the control and evaluation circuit 9d may provide the user with a feedback through the light source 9c to guide him in maintaining a certain use scheme. Thus, the user can for example be urged to carry out an actuation in the form of an approach or removal of a body part within a time period, which is made visible by a light signal.

In principle, other components can also be included in the operating device 1. However, it is essential that a cover device is provided with a partially metallized emblem and cover means can be backlit by a light-distribution device, where the lighting is controlled by a control and evaluation device. The combination with a proximity sensor then provides the above advantages of an integrated operating device with a user-friendly operating possibility.

The invention claimed is:

1. Activation device for actuation of a vehicle function, comprising a cover element, a light-distribution device arranged under the cover element, a light source arranged under or in the light-distribution device, wherein the light source and the light-distribution device are arranged for backlighting the cover element, wherein the cover element comprises an outward directed operation area at least partially formed of an electrically conductive metallic material, wherein the operation area is galvanically decoupled from the remaining components,
wherein a circuit board is arranged under the light-distribution device with a capacitive sensor in such a manner that the capacitive sensor is capacitively coupled with the operation area,
wherein a control and evaluation circuit is coupled with the light source and the capacitive sensor to control the light source depending on an approach, wherein underneath the cover element, a switch is arranged on the circuit board and the cover element is arranged movably opposite to the switch so that the switch is actuated by mechanical action on the cover element.

2. Activation device according to claim 1, wherein the cover element comprises a partially opaque front side and wherein the light-distribution device is designed to illuminate non-opaque sections of the cover element.

3. Activation device according to claim 1, wherein the light-distribution device comprises light conducting sections for conducting and directing the light from the light source.

4. Activation device according to claim 1, wherein the light-distribution device comprises diffuser sections for dissipating the light from the light source.

5. An actuation device for actuation of a vehicle function in an associated vehicle, comprising:
a cover element;
a light source adapted to cooperate with the cover element;
a capacitive sensor located under the cover element;
a switch located under the cover element, wherein the cover element is resiliently biased away from the switch;
a control and evaluation device coupled to the light source, the capacitive sensor and the switch;
an operation area defined in the cover element, wherein the operation area comprises an electrically conductive metallic material, wherein the operation area is galvanically decoupled from the associated vehicle and wherein the capacitive sensor is capacitively coupled to the operation area; and
wherein the light source can be actuated either via the capacitive sensor by an approach to the operation area of the cover element or via the switch by a mechanical action of the cover element.

6. The device of claim 5 further comprising a light distribution device located under the cover element.

7. The device of claim 6 wherein the light source and the light distribution device are arranged for backlighting the cover element.

8. The device of claim 6 wherein the light distribution device is bonded to the cover element.

9. The device of claim 5 wherein the switch comprises a microswitch which is pressure actuated by a movement of the cover element.

10. The device of claim 5 further comprising a circuit board, wherein the switch and the capacitive sensor are mounted on the circuit board.

11. The device of claim 10 wherein the light source is mounted on the circuit board.

12. The device of claim 10 wherein the operation area is galvanically separated from the circuit board by a non-metallized area of the cover element.

13. The device of claim 12 wherein the non-metallized area is translucent.

14. The device of claim 5 further comprising a housing structure which supports the cover element, the light source, the capacitive sensor and the switch.

* * * * *